United States Patent
Onishi et al.

(10) Patent No.: US 8,963,180 B2
(45) Date of Patent: Feb. 24, 2015

(54) EPOXY RESIN COMPOSITION FOR OPTICAL SEMICONDUCTOR DEVICE AND OPTICAL SEMICONDUCTOR DEVICE USING THE SAME

(75) Inventors: Hidenori Onishi, Osaka (JP); Shinya Ota, Osaka (JP); Kazuhiro Fuke, Osaka (JP)

(73) Assignee: Nitto Denko Corporation, Osaka (JP)

(*) Notice: Subject to any disclaimer, the term of this patent is extended or adjusted under 35 U.S.C. 154(b) by 214 days.

(21) Appl. No.: 13/570,451

(22) Filed: Aug. 9, 2012

(65) Prior Publication Data

US 2013/0037840 A1    Feb. 14, 2013

(30) Foreign Application Priority Data

Aug. 10, 2011 (JP) ................................ 2011-175119

(51) Int. Cl.
| | |
|---|---|
| H01L 33/60 | (2010.01) |
| H01L 33/56 | (2010.01) |
| C08L 63/00 | (2006.01) |
| C08G 59/20 | (2006.01) |
| C08G 59/42 | (2006.01) |
| C08K 5/06 | (2006.01) |
| C08K 3/22 | (2006.01) |
| C08L 63/06 | (2006.01) |

(52) U.S. Cl.
CPC .............. *H01L 33/60* (2013.01); *C08L 63/00* (2013.01); *C08G 59/42* (2013.01); *C08K 5/06* (2013.01); *C08K 2003/2241* (2013.01); *H01L 2933/0033* (2013.01); *H01L 2224/48091* (2013.01); *H01L 2224/48247* (2013.01); *H01L 2924/3025* (2013.01)
USPC .............. 257/98; 257/100; 523/458; 252/582

(58) Field of Classification Search
USPC ............. 252/582; 257/98, 100, 791; 523/465, 523/457, 458, 466
See application file for complete search history.

(56) References Cited

U.S. PATENT DOCUMENTS

| | | | |
|---|---|---|---|
| 2005/0221094 A1 | 10/2005 | Uchida et al. | |
| 2009/0095969 A1 | 4/2009 | Kotani et al. | |
| 2009/0304961 A1* | 12/2009 | Taguchi et al. | ............... 428/35.7 |
| 2010/0200882 A1* | 8/2010 | Kotani et al. | .................... 257/98 |

FOREIGN PATENT DOCUMENTS

| | | | | |
|---|---|---|---|---|
| JP | H11-241002 | A | 9/1999 | |
| JP | 2002-232017 | A | 8/2002 | |
| JP | 2002-283498 | A | 10/2002 | |
| JP | 2005-314684 | A | 11/2005 | |
| JP | 2006193566 | A * | 7/2006 | ............. C08G 59/42 |
| JP | 2008-106226 | A | 5/2008 | |
| JP | 2010-016292 | A | 1/2010 | |
| JP | 2010-21507 | A | 1/2010 | |
| WO | 2009/041472 | A1 | 4/2009 | |

OTHER PUBLICATIONS

Machine translation of JP 2006193566 A, provided by the JPO website (no date).*
Japanese Office Action corresponding to Japanese Patent Application No. 2011-175119, dated Sep. 22, 2014.

* cited by examiner

*Primary Examiner* — Michael J Feely
(74) *Attorney, Agent, or Firm* — Sughrue Mion, PLLC

(57) ABSTRACT

The present invention relates to an epoxy resin composition for an optical semiconductor device having an optical semiconductor element mounting region and having a reflector that surrounds at least a part of the region, the epoxy resin composition being an epoxy resin composition for forming the reflector, the epoxy resin composition including the following ingredients (A) to (E): (A) an epoxy resin; (B) a curing agent; (C) a white pigment; (D) an inorganic filler; and (E) a specific release agent.

10 Claims, 2 Drawing Sheets

EPOXY RESIN COMPOSITION FOR OPTICAL SEMICONDUCTOR DEVICE AND OPTICAL SEMICONDUCTOR DEVICE USING THE SAME

FIELD OF THE INVENTION

The present invention relates to an epoxy resin composition for an optical semiconductor device which is used as a material for forming a reflector (reflection part) that reflects light emitted from an optical semiconductor element (light emitting element) to impart directivity and that is formed at the periphery of the light emitting element. The invention further relates to an optical semiconductor device using the epoxy resin composition.

BACKGROUND OF THE INVENTION

Conventional optical semiconductor devices including an optical semiconductor element mounted therein have a configuration including a metallic lead frame 1, an optical semiconductor element 2 mounted thereon and a reflector 3 for light reflection formed of a resin material so as to surround the periphery of the optical semiconductor element 2, as shown in FIG. 1. Then, in general, a space including the optical semiconductor element 2 surrounded by the reflector 3 is encapsulated with a transparent resin such as a silicone resin. In FIG. 1, a numeral 4 denotes a bonding wire which electrically connects an electrode circuit (not shown) formed on the metallic lead frame 1 and the optical semiconductor element 2 with each other, and the bonding wire 4 is provided according to the need.

In such an optical semiconductor device, the reflector 3 for light reflection is manufactured using a thermoplastic resin represented by a polyphthalamide resin (PPA) or the like by means of injection molding. Then, a white pigment is generally blended in the foregoing thermoplastic resin to reflect the light emitted from the optical semiconductor element 2 (see Patent Document 1).

On the other hand, in the case where high heat resistance is required, a portion corresponding to the reflector 3 for light reflection is formed using mainly a ceramic material (see Patent Document 2). In this way, in the case where the portion corresponding to the reflector 3 is formed using the ceramic material, there may be the case where such formation is problematic from the viewpoints of mass production and costs of packages, and the like. In view of the foregoing matter, in forming the reflector 3, it is general to use a thermoplastic resin as described above.

In the case where a thermoplastic resin is used as a material for forming the reflector 3, the following problems arise. That is, recently, in view of the fact that a solder material to be used for mounting of an optical semiconductor device has becomes lead-free, a melting point of the solder material increases. As a result, in a surface mounting type package such as the foregoing optical semiconductor device, heat resistance to the high-temperature reflow environment is required. In consequence, with respect to a requirement of thermal deformation resistance and a requirement of thermal discoloration resistance at a solder-mounting temperature of the package, and a requirement of longer-period heat resistance due to an increase of the power of the optical semiconductor device 2, if the foregoing thermoplastic resin is used, discoloration or the like is generated at high temperatures, and following this, a lowering of light reflection efficiency, or the like becomes problematic.

In order to overcome those problems, if a thermosetting resin is used as the material for forming the reflector 3, it becomes possible to obtain a material for forming the reflector 3, which has excellent thermal discoloration resistance and which is provided with favorable light reflecting properties.

Patent Document 1: JP-A-2002-283498
Patent Document 2: JP-A-2002-232017

SUMMARY OF THE INVENTION

However, in forming a thermosetting resin composition using a thermosetting resin as the material for forming the reflector 3, a release agent is generally blended. In that case, however, if a large amount of a conventionally used release agent is added, there is involved such a problem that the reflector 3 formed using such a thermosetting resin composition is inferior in the mechanical strength so that it becomes brittle.

Under these circumstances, the invention has been made. An object of the invention is to provide an epoxy resin composition for an optical semiconductor device, from which a reflector having excellent thermal discoloration resistance, being capable of imparting favorable light reflecting properties, and further having excellent mechanical strength is obtainable; and an optical semiconductor light emitting device using the same.

Namely, the present invention relates to the following items 1 to 11.

1. An epoxy resin composition for an optical semiconductor device having an optical semiconductor element mounting region and having a reflector that surrounds at least a part of the region, the epoxy resin composition being an epoxy resin composition for forming the reflector,
   the epoxy resin composition including the following ingredients (A) to (E):
   (A) an epoxy resin;
   (B) a curing agent;
   (C) a white pigment;
   (D) an inorganic filler; and
   (E) a release agent represented by the following structural formula (1):

$$CH_3-(CH_2)_k-CH_2-O-(CHRm-CHRn-O)_x-H \quad (1)$$

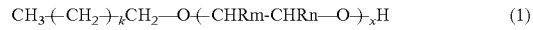

in which each of Rm and Rn represents a hydrogen atom or a monovalent alkyl group, and Rm and Rn may be the same or different from each other; k represents a positive number of from 1 to 100; and x represents a positive number of from 1 to 100.

2. The epoxy resin composition for an optical semiconductor device according to item 1, in which the ingredient (E) is a release agent represented by the following structural formula (2):

$$CH_3-(CH_2)_k-CH_2-O-(CH_2-CH_2-O)_x-H \quad (2)$$

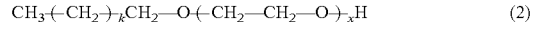

in which k represents an integer of from 28 to 48; and x represents an integer of from 5 to 20.

3. The epoxy resin composition for an optical semiconductor device according to item 1 or 2, in which the ingredient (E) is contained in an amount of from 0.01 to 3.0% by weight of the whole of the epoxy resin composition.

4. The epoxy resin composition for an optical semiconductor device according to any one of items 1 to 3, in which a total content of the white pigment as the ingredient (C) and the inorganic filler as the ingredient (D) is from 75 to 94% by weight of the whole of the epoxy resin composition.

5. The epoxy resin composition for an optical semiconductor device according to any one of items 1 to 4, in which the white pigment as the ingredient (C) is titanium oxide.

6. The epoxy resin composition for an optical semiconductor device according to any one of items 1 to 5, in which the epoxy resin as the ingredient (A) includes an epoxy resin having at least an isocyanuric ring structure.

7. The epoxy resin composition for an optical semiconductor device according to any one of items 1 to 6, in which the curing agent as the ingredient (B) is an acid anhydride.

8. The epoxy resin composition for an optical semiconductor device according to any one of items 1 to 7, further including a curing accelerator as an ingredient (F).

9. The epoxy resin composition for an optical semiconductor device according to any one of items 1 to 8, in which a surface of the reflector formed from the epoxy resin composition has a light reflectivity of 80% or more in a wavelength range of from 450 to 800 nm.

10. An optical semiconductor device including:
a lead frame for an optical semiconductor device, having an optical semiconductor element mounding region and having a reflector that surrounds at least a part of the region; and
an optical semiconductor element mounted on a prescribed position in the lead frame,
in which the reflector is formed from the epoxy resin composition for an optical semiconductor device according to any one of items 1 to 9.

11. The optical semiconductor device according to item 10, in which a region including the optical semiconductor element surrounded by the reflector is encapsulated with a silicone resin.

That is, in order to obtain an epoxy resin composition capable of becoming a material for forming a reflector which is inhibited from the generation of thermal deformation or discoloration, has excellent light reflecting properties, does not cause deterioration of the mechanical strength, and is able to impart mold release properties comparable to or more excellent than those of the related art, the present inventors made extensive and intensive investigations. As a result, it has been found that when the special release agent represented by the foregoing structural formula (1) is used as a release agent, high thermal discoloration resistance is imparted without lowering the strength of a reflector to be formed and the mold release properties at the time of die molding, and for example, fabrication by a molding die by means of transfer molding is possible, resulting in an advantage from the standpoint of mass production; and hence, the expected object is achieved, leading to accomplishment of the invention.

In the light of the above, the invention relates to an epoxy resin composition for an optical semiconductor device which is useful as a material for forming a reflector of an optical semiconductor device having an optical semiconductor element mounting region and having a reflector that surrounds at least a part of the region, the epoxy resin composition including the foregoing ingredients (A) to (D) and further including, as a release agent, a special compound [ingredient (E)] represented by the foregoing structural formula (1). For that reason, the epoxy resin composition of the invention exhibits high thermal discoloration resistance over a long period of time without lowering the strength of a reflector of an optical semiconductor device and the mold release properties at the time of die molding and also realizes favorable light reflecting properties. In consequence, in an optical semiconductor device equipped with the reflector formed using the foregoing epoxy resin composition, favorable light reflecting properties attributable to the reflector is maintained over a longer period of time, and hence, the reflector is able to sufficiently exhibit functions thereof.

When the content of the release agent as the component (E) is from 0.1 to 3.0% by weight of the whole of the epoxy resin composition, an epoxy resin composition capable of giving a cured material having much more excellent mechanical strength and mold release properties is obtainable.

In addition, when the total content of the foregoing white pigment [ingredient (C)] and inorganic filler [ingredient (D)] is from 75 to 94% by weight of the whole of the epoxy resin composition, not only a reduction of the linear expansion coefficient is contrived, but insurance of favorable flowability is realized.

Then, when titanium oxide is used as the white pigment [ingredient (C)], since favorable dispersibility, chemical stability and the like are revealed, excellent degree of whiteness and light reflecting properties are obtainable.

Furthermore, when the epoxy resin [ingredient (A)] includes an epoxy resin having an isocyanuric ring structure, excellent transparency and thermal discoloration resistance are obtainable.

DETAILED DESCRIPTION OF THE INVENTION

Figure 1:
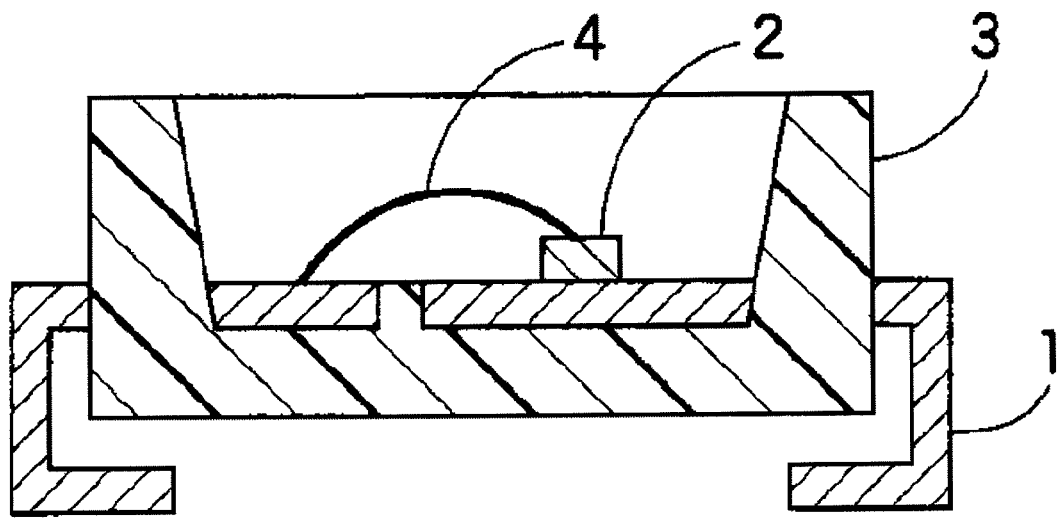
FIG. 1 is a sectional view schematically showing a configuration of an optical semiconductor device of the invention.

As described previously, the epoxy resin composition for an optical semiconductor device of the invention (hereinafter also referred to as "epoxy resin composition") is used as a material for forming a reflector 3 of an optical semiconductor device shown in FIG. 1. The epoxy resin composition of the invention is obtained using an epoxy resin (ingredient (A)), a curing agent (ingredient (B)), a white pigment (ingredient (C)), an inorganic filler (ingredient (D)) and a release agent (ingredient (E)) having a specified structure, and is usually used for an encapsulating material in a liquid or powdered form or in a tablet form obtained by tableting the powder.

<A: Epoxy Resin>

Examples of the epoxy resin (ingredient (A)) include bisphenol A type epoxy resins, bisphenol F type epoxy resins, bisphenol S type epoxy resins, novolac type epoxy resins such as phenol novolac type epoxy resins and cresol novolac type epoxy resins, alicyclic epoxy resins, nitrogen-containing ring epoxy resins such as monoglycidyl isocyanurate, diglycidyl isocyanurate, triglycidyl isocyanurate and hydantoin type epoxy resins, hydrogenated bisphenol A type epoxy resins, hydrogenated bisphenol F type epoxy resins, aliphatic epoxy resins, glycidyl ether type epoxy resins, diglycidyl ethers of an alkyl-substituted bisphenol or the like, glycidylamine type epoxy resins obtained by a reaction of a polyamines, for example, diaminodiphenylmethane, isocyanuric acid, etc., with epichlorohydrin, linear aliphatic epoxy resins obtained by oxidizing an olefin bond with a peracid, for example, peracetic acid, biphenyl type epoxy resins which are mainly used as the type giving cured resins with a low water absorption, dicyclic epoxy resins, and naphthalene type epoxy resins. These may be used alone or in combination of two or more kinds thereof. Of these epoxy resins, it is preferable to use an alicyclic epoxy resin or triglycidyl isocyanurate alone or in combination from the standpoints of excellent transparency, discoloration resistance and melt mixing properties with the foregoing polyorganosiloxane. For the same reason, diglycidyl esters of a dicarboxylic acid such as phthalic acid, tetrahydrophthalic acid, hexahydrophthalic acid, methyltetrahydrophthalic acid, nadic acid, and methylnadic acid are also suitable. In addition, examples of the epoxy resin further include glycidyl esters having an alicyclic structure formed by hydrogenation of an aromatic ring, such as nuclear-hydrogenated trimellitic acid and nuclear-hydrogenated pyromellitic acid.

The epoxy resin (ingredient (A)) may be a solid or a liquid at ordinary temperature. However, in general, the epoxy resin to be used is preferably an epoxy resin having an average epoxy equivalent of from 90 to 1,000. In addition, in the case of a solid epoxy resin, an epoxy resin having a softening point of from 50 to 160° C. is preferable from the viewpoint of convenience of handling. That is, this is because there may be the case where when the epoxy equivalent is too low, an epoxy resin composition cured material becomes brittle; whereas when the epoxy equivalent is too high, there is a tendency that a glass transition temperature (Tg) of an epoxy resin composition cured material becomes low.

<B: Curing Agent>

Examples of the curing agent (ingredient (B)) which is used in combination with the epoxy resin (ingredient (A)) include acid anhydride curing agents and isocyanuric acid derivative curing agents. Examples of the acid anhydride curing agent include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, and methyltetrahydrophthalic anhydride. These may be used alone or in combination of two or more kinds thereof. Of these acid anhydride curing agents, it is preferable to use phthalic anhydride, hexahydrophthalic anhydride, tetrahydrophthalic anhydride, or methylhexahydrophthalic anhydride. Furthermore, the acid anhydride curing agent is preferably a colorless or pale yellow acid anhydride curing agent.

Examples of the isocyanuric acid derivative curing agent include 1,3,5-tris(1-carboxymethyl)isocyanurate, 1,3,5-tris(2-carboxyethyl)isocyanurate, 1,3,5-tris(3-carboxypropyl)isocyanurate, and 1,3-bis(2-carboxyethyl)isocyanurate. These may be used alone or in combination of two or more kinds thereof. Furthermore, the isocyanuric acid derivative curing agent is preferably a colorless or pale yellow isocyanuric acid derivative curing agent.

In the light of the above, the curing agent (ingredient (B)) such as the above-described acid anhydride curing agents and isocyanuric acid derivative curing agents may be used alone or in combination of two or more kinds thereof. Furthermore, the curing agent (ingredient (B)) is preferably a colorless or pale yellow curing agent.

A blending portion of the epoxy resin (ingredient (A)) and the curing agent (ingredient (B)) is set such that an amount of an active group (an acid anhydride group or a carboxyl group) in the curing agent (ingredient (B)), which is capable of reacting with an epoxy group, is preferably from 0.5 to 1.5 equivalents, and more preferably from 0.7 to 1.2 equivalents to one equivalent of the epoxy group in the epoxy resin (ingredient (A)). That is, this is because when the amount of the active group is too low, there is a tendency that not only a curing rate of the epoxy resin composition becomes slow, but a glass transition temperature (Tg) of a cured material thereof becomes low; whereas when the amount of the active group is too high, there is a tendency that the moisture resistance is lowered.

In addition, in addition to the foregoing acid anhydride curing agent and isocyanuric acid derivative curing agent, other curing agents for an epoxy resin, for example, phenolic curing agents, amine curing agents, curing agents obtained by partially esterifying the foregoing acid anhydride curing agents with an alcohol, and carboxylic acid curing agents such as hexahydrophthalic acid, tetrahydrophthalic acid, and methylhexahydrophthalic acid, may be used alone or in combination of two or more kinds thereof for the curing agent (ingredient (B)) depending upon the purpose and application thereof. For example, in the case where a carboxylic acid curing agent is used in combination, the curing rate can be made fast, and the productivity can be enhanced. Incidentally, even in the case where these curing agents are used, a blending proportion thereof may be the same as the blending proportion (equivalent ratio) in the case of using the foregoing curing agent (ingredient (B)).

<C: White Pigment>

Examples of the white pigment (ingredient (C)) which is used in combination with the foregoing ingredient (A) and ingredient (B) include inorganic white pigments such as magnesium oxide, antimony oxide, titanium oxide, zirconium oxide, zinc oxide, white lead, kaolin, alumina, calcium carbonate, barium carbonate, barium sulfate, zinc sulfate, and zinc sulfide. These may be used alone or in combination of two or more kinds thereof. Of these, it is preferable to use titanium oxide from the viewpoint that an excellent light reflectivity is obtainable. It is especially preferable to use titanium oxide having a rutile type crystal structure. Furthermore, above all, from the viewpoints of flowability and light shielding properties, it is preferable to use titanium oxide of a rutile type having an average particle diameter of from 0.05 to 2.0 μm. Incidentally, the average particle diameter can be measured with, for example, a laser diffraction/scattering particle size distribution analyzer.

It is preferable to set a content of the white pigment (ingredient (C)) within the range of from 5 to 90% by weight of the whole of the resin composition. From the viewpoints of coloring properties and light reflecting properties, it is more preferable to set the content of the white pigment (ingredient (C)) within the range of from 10 to 80% by weight of the whole of the resin composition. That is, this is because when the content of the ingredient (C) is too low, there is a tendency that a sufficient light reflectivity is hardly obtained; whereas when the content of the ingredient (C) is too high, there is a possibility that an epoxy resin composition is hardly fabricated by means of kneading or the like because of remarkable thickening.

<D: Inorganic Filler>

For the purposes of reducing the linear expansion coefficient and enhancing the flowability, an inorganic filler (ingredient (D)) is used in combination with the foregoing ingredients (A) to (C) in the epoxy resin composition of the invention. Examples of the inorganic filler (ingredient (D)) include a quartz glass powder, talc, silica powders such as a fused silica powder and a crystalline silica powder, an aluminum nitride powder, and a silicon nitride powder. Of these, it is preferable to use a silica powder from the viewpoints of reducing the linear expansion coefficient, and the like. It is especially preferable to use a spherical fused silica powder from the viewpoints of high filling properties and high flowability. With respect to the particle diameter of the inorganic filler and its particle diameter distribution, it is preferable to set the particle diameter and distribution thereof while taking into consideration a combination thereof with the particle diameter of the white pigment (ingredient (C)) and its particle diameter distribution so as to minimize the occurrence of burrs and the like when the epoxy resin composition is formed into a molded material by transfer molding or the like. Specifically, it is preferable to allow an average particle diameter of the inorganic filler to fall within the range of from 0.1 to 100 μm. Incidentally, the average particle diameter can be measured with, for example, a laser diffraction/scattering particle size distribution analyzer.

It is preferable to set a content of the inorganic filler (ingredient (D)) such that a total content of the white pigment (ingredient (C)) and the inorganic filler (ingredient (D)) is from 10 to 98% by weight of the whole of the epoxy resin composition. From the viewpoints of reducing the linear expansion coefficient and ensuring the flowability, it is more preferable to set the total content of the white pigment (ingredient (C)) and the inorganic filler (ingredient (D)) to from 75 to 94% by weight.

<E: Release Agent Having a Specified Structure>

A release agent (ingredient (E)) having a specified structure, which is used in combination with the foregoing ingredients (A) to (D), is a special compound having an ether bond represented by the following structural formula (1).

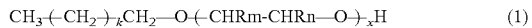

CH$_3$—(CH$_2$)$_k$CH$_2$—O—(CHRm-CHRn—O)$_x$H    (1)

In the foregoing formula (1), each of Rm and Rn represents a hydrogen atom or a monovalent alkyl group, and Rm and Rn may be the same or different from each other; k represents a positive number of from 1 to 100; and x represents a positive number of from 1 to 100.

In the foregoing formula (1), the repeating number k must be a positive number of from 1 to 100, and the repeating number x must be a positive number of from 1 to 100. Preferably, the repeating number k is a positive number of from 10 to 50, and the repeating number x is a positive number of from 3 to 30. More preferably, the repeating number k is a positive number of from 28 to 48, and the repeating number x is a positive number of from 5 to 20. That is, when the value of the repeating number k is too low, there is a tendency that the mold release properties are lowered; and when the value of the repeating number x is too low, the dispersibility is lowered, and hence, there is a tendency that stable strength and mold release properties are hardly obtained. In addition, when the value of the repeating number k is too high, the melting point becomes high, and hence, there is a tendency that it is difficult to perform kneading of the epoxy resin composition, and it is difficult to manufacture the epoxy resin composition; and when the value of the repeating number x is too high, there is a tendency that the mold release properties are lowered. On the other hand, each of Rm and Rn must be a hydrogen atom or a monovalent alkyl group, and Rm and Rn may be the same or different from each other. More preferably, all of Rm and Rn are a hydrogen atom. In consequence, it is especially preferable to use a compound having an ether bond represented by the following structural formula (2) as the compound having an ether bond represented by the foregoing formula (1).

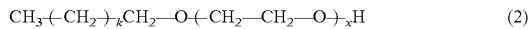

CH$_3$—(CH$_2$)$_k$CH$_2$—O—(CH$_2$—CH$_2$—O)$_x$H    (2)

In the foregoing formula (2), k represents an integer of from 28 to 48; and x represents an integer of from 5 to 20.

The compound having an ether bond represented by the foregoing structural formula (1) can be synthesized and fabricated by a known method. For example, the compound having an ether bond represented by the foregoing structural formula (1) can be synthesized by addition polymerization of ethylene oxide or propylene oxide on a monohydric alcohol corresponding to the positive number of from 1 to 100 in the value of k in the formula (1) in the presence of an acidic or basic catalyst. Examples of the foregoing compound having an ether bond as such a special release agent include UNITHOX 750 and UNITHOX 420, all of which are manufactured by Baker Petrolite Corporation.

A content of the foregoing release agent (ingredient (E)) having a specified structure is preferably from 0.01 to 3.0% by weight, and more preferably from 0.2 to 1.0% by weight of the whole of the epoxy resin composition. That is, this is because when the content of the ingredient (E) falls outside the foregoing range and is too high or too low, there is a tendency that a shortage of the strength or a lowering of the mold release properties is caused.

Incidentally, in the epoxy resin composition of the invention, a usual release agent other than the foregoing release agent (ingredient (E)) having a specified structure can be used in combination within the range where the effects of the invention are not inhibited. Specifically, such a usual release agent can be used in combination within the range where its proportion is 50% by weight or less of the whole of the release agent ingredient. The case where the release agent ingredient is composed of the foregoing release agent (ingredient (E)) having a specified structure is preferable. Examples of the foregoing usual release agent include compounds such as higher aliphatic acids, higher aliphatic acid esters, and higher aliphatic acid calcium salts. For example, a carnauba wax, a polyethylene based wax, and the like are useful. These may be used alone or in combination of two or more kinds thereof.

<Various Additives>

In addition to the foregoing ingredients (A) to (E), various additives such as a curing accelerator, a modifier, a flame retardant, a defoaming agent, and a leveling agent can be properly blended in the epoxy resin composition of the invention according to the need.

Examples of the curing accelerator include tertiary amines such as 1,8-diaza-bicyclo[5.4.0]undecene-7, triethylenediamine, tri-2,4,6-dimethylaminomethylphenol, N,N-dimethylbenzylamine, N,N-dimethylaminobenzene, and N,N-dimethylaminocyclohexane; imidazoles such as 2-ethyl-4-methylimidazole and 2-methylimidazole; phosphorus compounds such as triphenylphosphine, tetraphenylphosphonium tetraphenylborate, methylbutylphosphonium dimethyl phosphate, and tetra-n-butylphosphonium o,o-diethylphosphorodithioate; quaternary ammonium salts; organic metal salts; and derivatives thereof. These may be used alone or in combination of two or more kinds thereof. Of these curing accelerators, it is preferable to use a tertiary amine, an imidazole, or a phosphorus compound. Above all, in order to obtain a cured material which has a low degree of coloration and is transparent and tough, it is especially preferable to use a tertiary amine or a phosphorus compound.

A content of the curing accelerator is set to preferably from 0.001 to 8.0 parts by weight, and more preferably from 0.01 to 3.0 parts by weight based on 100 parts by weight of the epoxy resin (ingredient (A)). That is, this is because when the content of the curing accelerator is too low, there is a concern that a sufficient curing acceleration effect is not obtained; whereas when the content of the curing accelerator is too high, there is a tendency that the obtained cured material causes discoloration.

Examples of the modifier include conventionally known modifiers such as glycols, silicones, and alcohols.

Examples of the flame retardant include metal hydroxides such as magnesium hydroxide, bromine based flame retardants, nitrogen based flame retardants, and phosphorus based flame retardants. Furthermore, a flame retardant aid such as antimony trioxide can be used, too.

Examples of the defoaming agent include conventionally known defoaming agents such as silicone defoaming agents.

<Epoxy Resin Composition>

The epoxy resin composition of the invention can be, for example, manufactured in the following manner. That is, the foregoing ingredients (A) to (E) and optionally, various additives to be blended according to the need are properly blended. Thereafter, the blended material is kneaded and melt mixed using a kneader, etc., and subsequently, the mixture is cooled to room temperature, followed by pulverization or the like. There can be thus manufactured an epoxy resin composition in a powdered form.

Then, in a cured material of the thus obtained epoxy resin composition, a light reflectivity thereof is preferably 80% or more at a wavelength of from 450 to 800 nm. Incidentally, an upper limit thereof is usually 100%. The foregoing light reflectivity is, for example, measured in the following manner. That is, a cured material of an epoxy resin composition having a thickness of 1 mm is fabricated under prescribed curing conditions, for example, molding at 175° C. for 2 minutes and subsequent curing at 175° C. for 3 hours. The light reflectivity of this cured material at a wavelength within the foregoing range can be measured with a spectrophotometer (for example, a spectrophotometer V-670, manufactured by JASCO Corporation) at room temperature (25° C.±10° C.).

<Light Semiconductor Device>

The optical semiconductor device using the epoxy resin composition of the invention is, for example, manufactured in the following manner. That is, a metallic lead frame is disposed within a die of a transfer molding machine, and a reflector is formed using the epoxy resin composition by transfer molding. In this way, a metallic lead frame for an optical semiconductor device in which the reflector is formed in a state of surrounding the periphery of an optical semiconductor element mounting region. Subsequently, an optical semiconductor element is mounted in the optical semiconductor element mounting region on the metallic lead frame, which is located in the inside of the reflector, and wire bonding is performed according to the need. There is thus fabricated an optical semiconductor device as a unit equipped with a metallic lead frame 1 in which a reflector 3 is formed in a state of surrounding the periphery of an optical semiconductor element 2 to be mounted; and the optical semiconductor element 2 mounted on the metallic lead frame 1, as shown in FIG. 1. In FIG. 1, a numeral 4 is a bonding wire for electrically connecting an electrode circuit (not shown) formed on the metallic lead frame 1 and the optical semiconductor element 2 with each other. Incidentally, in the foregoing optical semiconductor device, a region which is located in the inside of the reflector 3 including the optical semiconductor element 2 is subjected to resin encapsulation with a silicone resin or the like.

Figure 2:
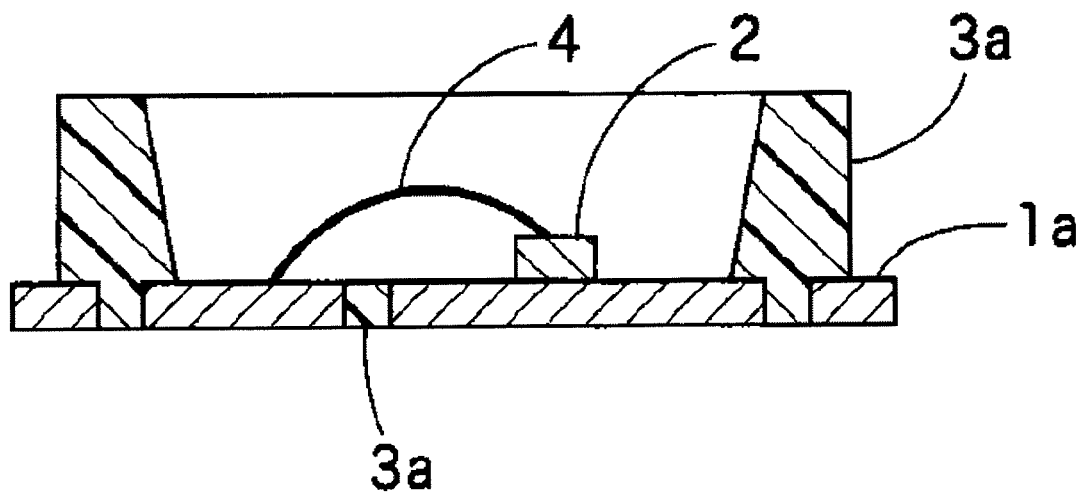
FIG. 2 is a sectional view schematically showing another configuration of an optical semiconductor device of the invention.
Figure 3:
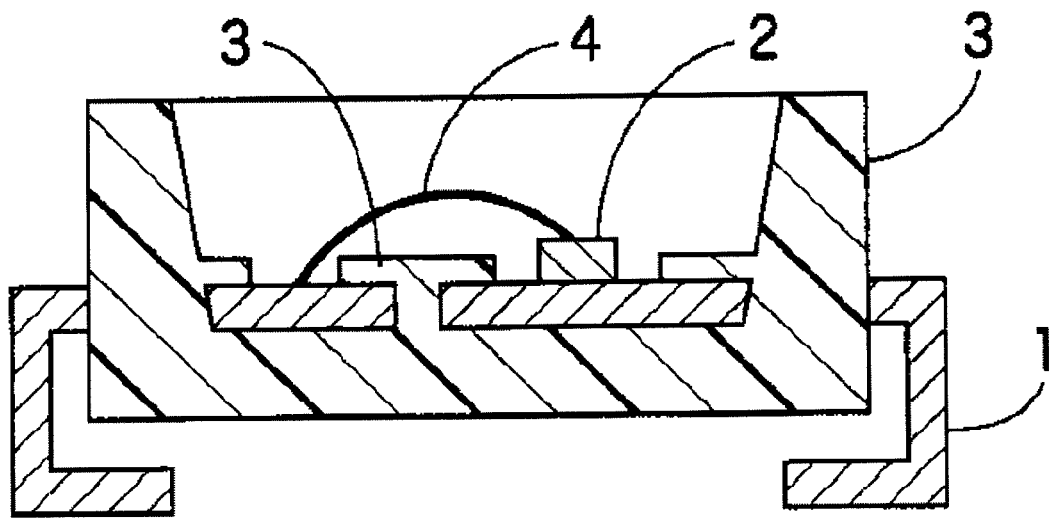
FIG. 3 is a sectional view schematically showing still another configuration of an optical semiconductor device of the invention.
Figure 4:
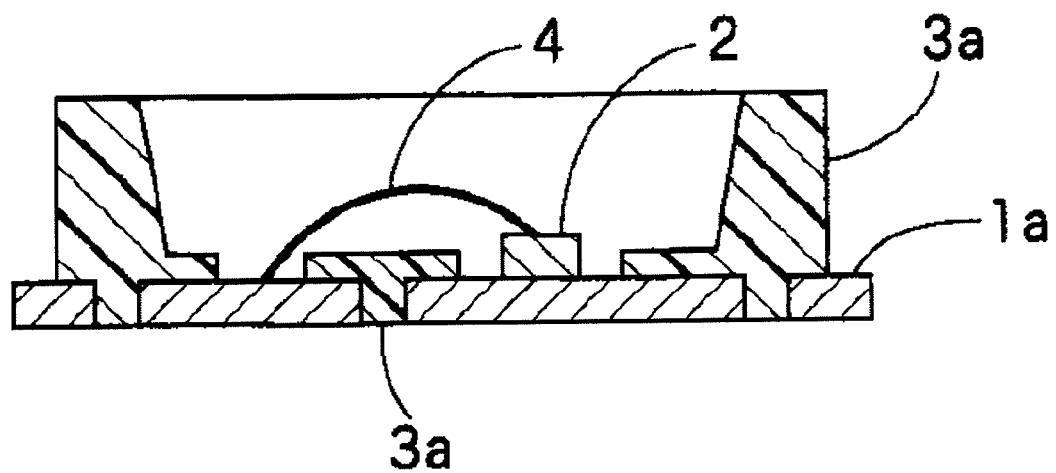
FIG. 4 is a sectional view schematically showing yet still another configuration of an optical semiconductor device of the invention.

Furthermore, other configurations of the optical semiconductor device are shown in FIG. 2 to FIG. 4. In an optical semiconductor device shown in FIG. 2, a reflector 3a is formed only on a metallic lead frame 1a (or a substrate) on which an optical semiconductor element 2 is mounted. In addition, an optical semiconductor device shown in FIG. 3 has substantially the same configuration as that of the optical semiconductor device shown in FIG. 1; however, a reflector 3 is also formed on a metallic lead frame 1 at the periphery of an optical semiconductor element 2 in the inner region of the reflector 3. Then, an optical semiconductor device shown in FIG. 4 has substantially the same configuration as that of the optical semiconductor device shown in FIG. 2; however, a reflector 3a is also formed on a metallic lead frame 1a (or a substrate) at the periphery of an optical semiconductor element 2 in the inner region of the reflector 3a. In the configurations of the optical semiconductor devices shown in FIG. 2 to FIG. 4, the same parts as those in the optical semiconductor device shown in FIG. 1 are designated by the same numerals and signs.

Incidentally, in the invention, in the optical semiconductor devices shown in the foregoing FIG. 2 and FIG. 4, various substrates may be used in place of the metallic lead frame 1a. Examples of the various substrates include organic substrates, inorganic substrates, and flexible printed substrates. Then, in the metallic lead frames 1a of the optical semiconductor devices shown in the foregoing FIG. 2 and FIG. 4 and the various substrates, an electrode circuit (not shown) is formed on the surface thereof.

EXAMPLES

Next, Examples are given below together with Comparative Examples. However, it should not be construed that the invention is limited to these Examples.

First of all, prior to the fabrication of epoxy resin compositions, materials shown below were prepared.

[Epoxy Resin]
Triglycidyl isocyanurate (epoxy equivalent: 100)

[Acid Anhydride]
Methylhexahydrophthalic anhydride (acid anhydride equivalent: 168)

[Titanium Oxide]
Rutile type titanium oxide, average particle diameter: 0.2 µm

[Silica Powder]
Spherical fused silica, average particle diameter: 23 µm

[Release agent e1] (Example)
Compound having the structural formula (1) wherein k is 48; x is 20; and each of Rm and Rn is a hydrogen atom (UNITHOX 750, manufactured by Baker Petrolite Corporation)

[Release agent e2] (Example)
Compound having the structural formula (1) wherein k is 28; x is 5; and each of Rm and Rn is a hydrogen atom (UNITHOX 420, manufactured by Baker Petrolite Corporation)

[Release agent e3] (Comparative Example)
Ethylene alcohol represented by a structural formula: OH—$(CH_2)_y$—OH (y=20) (UNILIN 425, manufactured by Baker Petrolite Corporation)

[Curing Accelerator]
N,N-Dimethylbenzylamine

Examples 1 to 10 and Comparative Examples 1 to 4

Respective ingredients shown in each of the following Tables 1 and 2 were blended in proportions shown in each of these tables and melt mixed. After the mixture was aged, the resulting mixture was cooled to room temperature and pulverized to fabricate a desired epoxy resin composition in a powdered form.

Each of the thus obtained epoxy resin compositions of the Examples and Comparative Examples was evaluated for various characteristics (evaluated by flexural test and mold releasing load test) according to the following methods. Results are also shown in each of the foregoing Tables 1 and 2.

[Flexural Test]

Each of the foregoing epoxy resin compositions was cured under prescribed cording conditions (conditions: molding at 175° C. for 2 minutes and subsequent curing at 175° C. for 2 hours) to fabricate a test piece having a thickness of 4 mm, a width of 10 mm, and a length of 80 mm. This test piece (cured material) was measured for a flexural characteristic in conformity with JIS K7171:2008. Incidentally, a flexural testing machine AG-500, manufactured by Shimadzu Corporation was used as an analyzer; a flexural characteristic was obtained at ordinary temperature (25° C.); and a flexural strength was calculated. A value at which the flexural strength was the maximum is described. Then, the flexural strength value was decided and evaluated according to the following three grades.

A: The flexural strength value exceeds 90 MPa.

B: The flexural strength value is 69 MPa or more and 90 MPa or less.

C: The flexural strength value is less than 69 MPa.

[Mold Releasing Load Test]

The epoxy resin composition was tableted to form a tablet. The tablet was subjected to die molding under prescribed curing conditions (conditions: molding at 175° C. for 2 minutes and subsequent curing at 175° C. for 2 hours) to fabricate a cured material in a circular truncated cone shape having a thickness of 20 mm, a top side diameter of 18 mm, and a bottom side diameter of 19 mm. A load (mold releasing load) necessary for vertically extruding and discharging the cured material from the die was measured with a push-pull gauge, manufactured by Aikoh Engineering Co., Ltd. The mold releasing load value was decided and evaluated according to the following three grades.

A: The mold releasing load value is 30 kg or less.

B: The mold releasing load value exceeds 30 kg and is 35 kg or less.

C: The mold releasing load value exceeds 35 kg.

[Overall decision]

On the basis of measurement results of the foregoing flexural test and mold releasing load test, the epoxy resin composition was overall decided and evaluated according to the following three grades. At that time, the flexural strength value is preferably from 69 to 150 MPa, and more preferably from 90 to 145 MPa. In addition, the mold releasing load value is preferably from 2 to 35 kg, and more preferably from 5 to 30 kg. Then, the overall decision was made according to the following three grades on the basis of the respective values of the flexural strength and mold releasing load.

A: The flexural strength is from 90 to 145 MPa, and the mold releasing load is from 5 to 30 kg (the both ranges are satisfied).

B: Not only the measured value is satisfied with either the flexural strength of from 90 to 145 MPa or the mold releasing load of 5 to 30 kg, but the unsatisfied measured value (either the flexural strength or the mold releasing load) is satisfied with either the range of from 69 to 150 MPa in the case of the flexural strength, or the range of from 2 to 35 kg in the case of the mold releasing load.

C: Not only the measured value is satisfied with either the flexural strength of from 69 to 150 MPa or the mold releasing load of 2 to 35 kg, but the unsatisfied measured value (either the flexural strength or the mold releasing load) falls outside the range of from 69 to 150 MPa in the case of the flexural strength, or the range of from 2 to 35 kg in the case of the mold releasing load. Alternatively, the both measured values of the flexural strength and the mold releasing load fall outside any of the flexural strength of from 69 to 150 MPa and the mold releasing load of from 2 to 35 kg.

TABLE 1

| | | | | | | | | | | | (parts by weight) |
|---|---|---|---|---|---|---|---|---|---|---|---|
| | | | | | | Example | | | | | |
| | | 1 | 2 | 3 | 4 | 5 | 6 | 7 | 8 | 9 | 10 |
| Epoxy resin (A) | | 100 | 100 | 100 | 100 | 100 | 100 | 100 | 100 | 100 | 100 |
| Acid anhydride (B) | | 165 | 165 | 165 | 165 | 165 | 165 | 165 | 165 | 165 | 165 |
| Curing accelerator | | 0.75 | 0.75 | 0.75 | 0.75 | 0.75 | 0.75 | 0.75 | 0.75 | 0.75 | 0.75 |
| Release agent (E) | e1 | 1.36 | 2.77 | 4.12 | 5.59 | 8.48 | 14.60 | 48.01 | — | — | — |
| | e2 | — | — | — | — | — | — | — | 4.12 | 8.48 | 14.60 |
| | e3 | — | — | — | — | — | — | — | — | — | — |
| Silica powder (D) | | 805 | 806 | 810 | 813 | 821 | 850 | 931 | 810 | 821 | 850 |
| Titanium oxide (C) | | 275 | 275 | 276 | 277 | 279 | 289 | 317 | 276 | 279 | 289 |
| Blending proportion of release agent (% by weight) | | 0.1 | 0.2 | 0.3 | 0.4 | 0.6 | 1.0 | 3.0 | 0.3 | 0.6 | 1.0 |
| Flexural strength | Measured value (MPa) | 130 | 126 | 121 | 121 | 97 | 71 | 69 | 111 | 101 | 88 |
| | Evaluation | A | A | A | A | A | B | B | A | A | B |
| Mold releasing load | Measured value (kg) | 35 | 25 | 16 | 13 | 16 | 15 | 13 | 30 | 14 | 15 |
| | Evaluation | B | A | A | A | A | A | A | A | A | A |
| Overall decision | | B | A | A | A | A | B | B | A | A | B |

TABLE 2

| | | | (parts by weight) | | |
|---|---|---|---|---|---|
| | | | Comparative Example | | |
| | | 1 | 2 | 3 | 4 |
| Epoxy resin (A) | | 100 | 100 | 100 | 100 |
| Acid anhydride (B) | | 165 | 165 | 165 | 165 |
| Curing accelerator | | 0.75 | 0.75 | 0.75 | 0.75 |
| Release agent (E) | e1 | — | — | — | — |
| | e2 | — | — | — | — |
| | e3 | — | 4.12 | 8.48 | 14.60 |
| Silica powder (D) | | 800 | 810 | 821 | 850 |
| Titanium oxide (C) | | 272 | 276 | 279 | 289 |
| Blending proportion of release agent (% by weight) | | 0 | 0.3 | 0.6 | 1.0 |
| Flexural strength | Measured value (MPa) | 142 | 112 | 100 | 92 |
| | Evaluation | A | A | A | A |
| Mold releasing load | Measured value (kg) | >45 | 39 | 40 | 38 |
| | Evaluation | C | C | C | C |
| Overall decision | | C | C | C | C |

From the foregoing results, in all of the test pieces of the Examples, the flexural strength was high, and the mold releasing load was low. It is noted from this fact that test pieces having also an excellent mechanical strength were obtained without impairing the mold release properties.

On the other hand, in the test pieces of the Comparative Examples, it is noted that a high value regarding the flexural strength is obtained, and an excellent mechanical strength is revealed; however, the mold releasing load is high, and the mold release properties are inferior.

[Measurement of Light Reflectivity]

Furthermore, each of the foregoing epoxy resin compositions was cured under prescribed curing conditions (conditions: molding at 175° C. for 2 minutes and subsequent curing at 175° C. for 2 hours) to fabricate a test piece having a thickness of 1 mm. This test piece (cured material) was measured for a light reflectivity. Incidentally, a spectrophotometer V-670, manufactured by JASCO Corporation was used as an analyzer, and the light reflectivity at a wavelength of 450 nm was measured at room temperature (25° C.). As a result, in all of the test pieces of the Examples, the light reflectivity was 80% or more.

[Manufacture of Optical Semiconductor Device]

Next, the epoxy resin composition in a finely powered form as the test piece of each of the foregoing Examples was used to manufacture an optical semiconductor device (optical semiconductor light emitting device) having the configuration shown in FIG. 1. That is, a lead frame 1 made of Alloy 42 (plated with Ag) was charged in a transfer molding machine, and transfer molding (molding conditions: molding at 175° C. for 2 minutes and subsequent curing at 175° C. for 2 hours) was performed. There was thus manufactured a constituent member composed of a reflector 3, a concave formed in the reflector 3, and a lead frame 1 provided within the concave, as shown in FIG. 1. Subsequently, an optical semiconductor element 2 (size: 0.3 mm×0.3 mm) was mounted within the concave, and an electrode circuit formed on the metallic lead frame 1 and the optical semiconductor element 2 were electrically connected with each other by a bonding wire 4. Finally, an encapsulating agent composed of a liquid silicone resin (KER-2500, manufactured by Shin-Etsu Chemical Co., Ltd.) was poured into the concave having the optical semiconductor element 2 mounted thereon and thermally cured (curing conditions: at 100° C. for one hour and then at 150° C. for 5 hours), thereby manufacturing an optical semiconductor light emitting device as a unit equipped with the reflector 3, the concave formed in the reflector 3, the metallic lead frame 1 provided within the concave, and the optical semiconductor element 2 mounted on the metallic lead frame 1, as shown in FIG. 1. There was thus obtained an optical semiconductor light emitting device having no problem.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2011-175119 filed on Aug. 10, 2011, and the contents are incorporated herein by reference.

All references cited herein are incorporated by reference herein in their entirety.

The epoxy resin composition for an optical semiconductor device of the invention is useful as a material for forming a reflector that reflects light emitted from an optical semiconductor element mounted in an optical semiconductor device.

DESCRIPTION OF REFERENCE NUMERALS AND SIGNS

1: Metallic lead frame
2: Optical semiconductor element
3: Reflector
4: Bonding wire

What is claimed is:

1. An epoxy resin composition for an optical semiconductor device having an optical semiconductor element mounting region and having a reflector that surrounds at least a part of the region, the epoxy resin composition being an epoxy resin composition for forming the reflector, the epoxy resin composition comprising the following ingredients (A) to (E):
(A) an epoxy resin;
(B) a curing agent;
(C) a white pigment;
(D) an inorganic filler; and
(E) a release agent represented by the following structural formula (I):

$$CH_3\text{-}(CH_2)_k\text{-}CH_2\text{-}O\text{-}(CHRm\text{-}CHRn\text{-}O)_x\text{-}H \quad (1)$$

in which each of Rm and Rn represents a hydrogen atom; k is 48; and x is 20.

2. The epoxy resin composition for an optical semiconductor device according to claim 1, wherein the ingredient (E) is contained in an amount of from 0.01 to 3.0% by weight of the whole of the epoxy resin composition.

3. The epoxy resin composition for an optical semiconductor device according to claim 1, wherein a total content of the white pigment as the ingredient (C) and the inorganic filler as the ingredient (D) is from 75 to 94% by weight of the whole of the epoxy resin composition.

4. The epoxy resin composition for an optical semiconductor device according to claim 1, wherein the white pigment as the ingredient (C) is titanium oxide.

5. The epoxy resin composition for an optical semiconductor device according to claim 1, wherein the epoxy resin as the ingredient (A) comprises an epoxy resin having at least an isocyanuric ring structure.

6. The epoxy resin composition for an optical semiconductor device according to claim 1, wherein the curing agent as the ingredient (B) is an acid anhydride.

7. The epoxy resin composition for an optical semiconductor device according to claim 1, further comprising a curing accelerator as an ingredient (F).

8. The epoxy resin composition for an optical semiconductor device according to claim 1, wherein a surface of the reflector formed from the epoxy resin composition has a light reflectivity of 80% or more in a wavelength range of from 450 to 800 nm.

9. An optical semiconductor device comprising:
a lead frame for an optical semiconductor device, having an optical semiconductor element mounting region and having a reflector that surrounds at least a part of the region; and
an optical semiconductor element mounted on a prescribed position in the lead frame,
wherein the reflector is formed from the epoxy resin composition for an optical semiconductor device according to claim 1.

10. The optical semiconductor device according to claim 9, wherein a region including the optical semiconductor element surrounded by the reflector is encapsulated with a silicone resin.

* * * * *